(12) United States Patent
Shin et al.

(10) Patent No.: US 6,670,268 B2
(45) Date of Patent: Dec. 30, 2003

(54) METAL INTERCONNECTION WITH LOW RESISTANCE IN A SEMICONDUCTOR DEVICE AND A METHOD OF FORMING THE SAME

(75) Inventors: Ju-Cheol Shin, Seoul (KR); In-Sun Park, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/134,748

(22) Filed: Apr. 30, 2002

(65) Prior Publication Data

US 2002/0173129 A1 Nov. 21, 2002

(30) Foreign Application Priority Data

May 18, 2001 (KR) ........................................ 2001-27318

(51) Int. Cl.[7] ......................................... H01L 21/4763
(52) U.S. Cl. ..................... 438/637; 438/597; 438/618; 438/622; 438/586
(58) Field of Search ................................. 438/597, 618, 438/622, 637, 669, 672, 586

(56) References Cited

U.S. PATENT DOCUMENTS 6,488,509 B1 * 12/2002 Ho et al. .................... 438/629

* cited by examiner

Primary Examiner—Richard Elms
Assistant Examiner—Beth E. Owens
(74) Attorney, Agent, or Firm—Lee & Sterba, P.C.

(57) ABSTRACT

The present invention relates to metal interconnections for bit lines having a low resistance and an advanced morphology and a method of forming the same including: forming an inter-layer insulation film on a semiconductor substrate, the inter-layer insulation film containing a contact hole for the bit line; forming a plug within the contact hole; forming a barrier metal defined on the plug; and forming a bit line on the inter-layer insulation film.

31 Claims, 19 Drawing Sheets

METAL INTERCONNECTION WITH LOW RESISTANCE IN A SEMICONDUCTOR DEVICE AND A METHOD OF FORMING THE SAME

BACKGROUND OF THE INVENTION

1. Field of the Invention

The present invention relates to metal interconnections in semiconductor devices. More specifically, the present invention relates to metal interconnections for bit lines having low resistance, and a method of forming the same. The present invention encompasses techniques for reducing resistance of bit lines and for providing advanced morphology of metal interconnections associated with bit lines.

2. Description of the Related Art

Conventionally, increased integration density of semiconductor devices causes the number of fabricating steps to increase and design rules to become more restricted and complicated. Design rules in manufacturing semiconductor devices, e.g., semiconductor memories, are most relevant to a width of conductive lines for interconnecting between active regions, such as bit lines, word lines, and metal lines, or to operable pitches between the conductive interconnection lines. While narrower widths (or dimensions) of interconnection lines are helpful to enhance integration density of semiconductor memory devices, increased resistance thereon may affect propagation efficiencies of electrical carriers such as voltage or current. Such an increase of resistance through interconnection lines degrades operating speeds in semiconductor memory devices. This is especially problematic, as most semiconductor memory devices need to be operable in a higher frequency.

Procedures for forming typical interconnection lines, or bit lines, in a semiconductor memory device as shown in FIG. 1, are shown in FIGS. 2A through 2F and FIGS. 3A through 3F. FIGS. 2A through 2F illustrate procedures to complete bit lines in a view taken along sectional line X1–X1' of FIG. 1. FIGS. 3A through 3F also illustrate these procedures in a view taken along sectional line X2–X2' of FIG. 1, which is orthogonal to X1–X1', both of FIG. 1.

Referring to FIGS. 2A and 3A, a contact hole 12 for a polysilicon plug is formed by a photolithography process after evaporating a first inter-layer insulation film 11 on a substrate 10. After depositing a polysilicon film on the first inter-layer insulation film 11 and the contact hole 12, a polysilicon plug 13 is patterned by a photolithography process. Next, a second interlayer insulation film 14 is deposited on the first inter-layer insulation film 11 and the polysilicon plug 13. A photolithography process is conducted to expose the polysilicon plug 13 by removing a portion of the second interlayer insulation film 14 on the polysilicon plug 13, so that a bit line contact hole (DC: direct contact) 15 is formed. The bit line contact hole 15 may also be seen in a top elevation view as reference numeral 100 in FIG. 1.

Referring to FIGS. 2B and 3B, a barrier metal 16 and a metal film 17 are sequentially deposited on the second inter-layer insulation film 14 and the bit line contact hole 15. The barrier metal 16 is made of Ti/TiN film evaporated by CVD (chemical vapor deposition). The metal film 17 is made of tungsten (W) evaporated by CVD.

Referring to FIGS. 2C and 3C, a CMP (chemical-mechanical polishing) is carried out to etch the barrier metal 16 and the metal film 17 flat. After the CMP process, the barrier metal 16 and the metal film 17 remain only in the bit line contact hole 15, forming a bit line plug 18. The CMP process removes other portions of the barrier metal 16 and the metal film 17 on the second inter-layer insulation film 14.

Referring to FIGS. 2D and 3D, a bit line metal film 19 is formed on the bit line plug 18 and the second inter-layer insulation film 14. The bit line metal film 19 is a tungsten film evaporated by CVD, so that the bit line plug 18 is defined to fill the contact hole 15.

Referring to FIGS. 2E and 3E, a capping layer 20 is deposited on the bit line metal film 19. The capping layer 20, made of a nitride, is utilized as a hard mask for a bit line patterning process performed in a subsequent step.

Finally, referring to FIGS. 2F and 3F, a photolithography process is used to pattern a bit line 21 (corresponding to reference numeral 110 shown in FIG. 1) formed from the bit line metal film 19 and the capping layer 20.

However, in the procedure of forming the bit line 21 according to the processing steps shown in FIGS. 2A–2F (or 3A–3F), there is a problem in that an over-etching occurs, which results in the removal of a portion of the CVD tungsten metal film 17 used for the plug 18 as shown in FIG. 2F. The over-etching after bit line patterning arises from the fact that a width of the bit line 110 of FIG. 1 (or 21 of FIGS. 2F and 3F) is intentionally defined to be narrower than a diameter of the contact hole 100 of FIG. 1 (or 15 of FIGS. 2F and 3F) because the bit line becomes more slender according to an increase in an integration density. The undesirable over-etch of the plug metal film 17 causes a single-bit fail that degrades reliability of a memory device and may cause subsequent processing difficulties.

To overcome these difficulties, a method has been suggested that uses a barrier metal formed on the plug metal film (i.e., the CVD tungsten film) as an etch stopper to protect the plug metal film against over-etching. FIGS. 4A–4F and 5A–5F illustrate steps in a conventional procedure that uses the barrier metal for protecting the plug metal film against over-etching. FIGS. 4A–4F illustrate processing steps and are shown taken along the sectional line X1–X1' of FIG. 1. FIGS. 5A–5F illustrate the same processing steps and are shown taken along the sectional line X2–X2' of FIG. 1.

Referring to FIGS. 4A and 5A, a contact hole 32 for a polysilicon plug is formed by a photolithography process after evaporating a first inter-layer insulation film 31 on a substrate 30. After depositing a polysilicon film on the first inter-layer insulation film 31 and the contact hole 32, a polysilicon plug 33 is patterned by a photolithography process. Next, a second interlayer insulation film 34 is deposited on the first inter-layer insulation film 31 and the polysilicon plug 33. A photolithography process is performed to expose the polysilicon plug 33 by removing a portion of the second interlayer insulation film 34 on the polysilicon plug 33, so that a bit line contact hole (DC: direct contact) 35 is formed. The bit line contact hole 35 may also be seen in a top elevation view as reference numeral 100 in FIG. 1.

Referring to FIGS. 4B and 5B, a barrier metal 36 and a metal film 37 are sequentially deposited on the second inter-layer insulation film 34 and the bit line contact hole 35. The barrier metal 36 is made of Ti/TiN film evaporated by CVD (chemical vapor deposition). The metal film 37 is tungsten (W) evaporated by CVD.

Referring to FIGS. 4C and 5C, a CMP (chemical-mechanical polishing) process is carried out to etch the barrier metal 36 and the metal film 37 flat. After the CMP process, the barrier metal 36 and the metal film 37 remain only in the bit line contact hole 35, forming a bit line plug 38. The CMP process removes other parts of the barrier metal 36 and the metal film 37 on the second inter-layer insulation film 34, so that the bit line plug 38 is defined to fill the contact hole 35.

Referring to FIGS. 4D and 5D, an additional barrier metal 39 is formed on the bit line plug 38 and the second inter-layer insulation film 34. The barrier metal 39 is a titanium nitride evaporated by CVD. The barrier metal 39 acts as an etch stopper in a subsequent processing step of patterning bit lines.

Referring to FIGS. 4E and 5E, a bit line metal film 40 and a bit line capping layer 41 are sequentially deposited on the barrier metal 39. The capping layer 41, made of a nitride, is utilized as a hard mask for a bit line patterning process performed in a subsequent step. The bit line metal film 40 is a tungsten film evaporated by CVD.

Finally, referring to FIGS. 4F and 5F, a photolithography process patterns a bit line 42 (corresponding to reference numeral 110 shown in FIG. 1), formed of the barrier metal 39, the bit line metal film 40, and the capping layer 41, by etching the capping layer 41, the bit line metal film 40, and the barrier metal in that order. At this time, the barrier metal 39 acts as an etch stopper when the capping layer 41 and the bit line metal film 40 are partially etched away.

The barrier metal 39, acting as an etch stopper, protects the metal film 37 from the etching process by which the bit line metal film 40 of CVD tungsten is removed, thereby enhancing operational reliabilities directed to the single-bit fail and facilitating performance of subsequent processing steps. Nevertheless, several defects also occur due to the presence of the barrier metal 39 under the bit line metal film 40 of CVD tungsten. These defects include an increased resistance of the bit lines and bad morphology.

FIG. 11A shows an example morphology, i.e., optical microscopy of a tungsten film as the bit line metal film that is evaporated on the barrier metal 39 of titanium nitride by means of CVD with a thickness of 800 Å. As shown in FIG. 11A, resistance of the bit line, Rs, is 2.5 Ω, which is regarded to be more than any value normally acceptable, and morphology thereof rates at about 3.0 nm in the dimension of AFM RMS (Auto Force Microscopy Root Mean Square).

Therefore, with respect to the case that a bit line constructed of an 800 Å CVD tungsten film and a 2500 Å nitride film is formed on a CVD titanium nitride that acts as a barrier metal, an increased resistance of the bit line due to the barrier metal limits ACI CD (After Cleaning Inspection Critical Dimension) to be finer than 105 nm. Furthermore, such weak morphology (about 3.0 nm) is not helpful for reducing defects appearing after patterning bit lines, which causes limitations in decreasing width of bit lines.

SUMMARY OF THE INVENTION

It is therefore a feature of an embodiment of the present invention to provide a metal interconnection structure capable of high integration of a semiconductor device, and a method of forming the same.

It is another feature of an embodiment of the present invention to provide a metal interconnection structure that is capable of reducing resistance of bit lines even though a width of the bit lines becomes narrower, and a method of forming the same.

It is another feature of an embodiment of the present invention to provide a metal interconnection structure that is capable of obtaining better morphology for bit lines and a method of forming the same.

It is still another feature of an embodiment of the present invention to provide a metal interconnection structure that is capable of enhancing reliability of a semiconductor device and a method of forming the same.

It is yet another feature of an embodiment of the present invention to provide a metal interconnection structure having better morphology and lower resistance, for bit lines, and a method of forming the same.

In order to provide these and other features, according to an embodiment of the present invention, there is provided a method of forming an inter-layer insulation film on a semiconductor substrate, the inter-layer insulation film containing a bit line contact hole, forming a plug in the bit line contact hole, and forming a bit line including a bit line barrier metal formed on the plug and a bit line metal film formed on the bit line barrier metal and the inter-layer insulation film.

Preferably, the plug is formed by depositing a plug barrier metal on the inter-layer insulation film and in the bit line contact hole; depositing a plug metal film on the plug barrier metal; and forming the plug constructed of the plug barrier metal and the plug metal film, which fill the bit line contact hole, by etching the plug barrier metal and the plug metal film. The plug barrier metal is preferably made of a Ti/TiN film evaporated by means of a CVD process. The plug metal film is preferably made of a tungsten film evaporated by means of a CVD process. Preferably, the plug barrier metal and the plug metal film are etched flat by means of a CMP process or an etch-back process, so that they form the plug filling the bit line contact hole.

Several ways to form the bit line barrier metal will now be described. First, the bit line barrier metal is formed by partially etching the plug within the bit line contact hole; depositing the bit line barrier metal on the inter-layer insulation film and on the plug that is partially etched away; and etching the bit line barrier metal to be defined on the plug within the bit line contact hole. Alternatively, the bit line barrier metal may be formed by depositing a bit line barrier metal on the inter-layer insulation film and on the plug; and patterning the bit line barrier metal to be defined on the plug.

The bit line barrier metal is preferably a TiN film evaporated by means of either a CVD process or a sputtering process. The bit line metal film is preferably made of a sputtered tungsten film. The bit line further includes a capping layer made of a nitride film formed on the bit line metal film. A width of the bit line is smaller than a diameter of the contact hole.

Preferably, an embodiment of the present invention also provides a method of forming a metal interconnection structure including forming an inter-layer insulation film on a semiconductor substrate, the inter-layer insulation film containing a bit line contact hole; forming a plug in the bit line contact hole; partially etching the plug in the bit line contact hole; forming a bit line barrier metal completely on the plug that has been partially etched; and forming a bit line on the bit line barrier metal and the inter-layer insulation film.

Furthermore, an embodiment of the present invention also preferably provides a method of forming a metal interconnection structure including forming an inter-layer insulation film on a semiconductor substrate; forming a bit line contact hole by selectively etching the inter-layer insulation film; forming a plug in the bit line contact hole; depositing a bit line barrier metal on the plug and the inter-layer insulation film; etching the bit line barrier metal to be formed completely on the plug; and forming a bit line on the bit line barrier metal and the inter-layer insulation film.

In addition, an embodiment of the present invention provides an advanced structure of metal interconnection for a semiconductor device, including an inter-layer insulation film formed on a semiconductor substrate, containing a bit line contact hole, a plug formed in the contact hole, and a bit line including a bit line barrier metal defined on the plug within the contact hole, and a bit line metal film formed on the bit line barrier metal and the inter-layer insulation film.

The plug preferably includes a plug barrier metal formed in the contact hole, and a plug metal film formed on the plug barrier metal and partially filling the contact hole. The bit line barrier metal is preferably a TiN film formed on the plug metal film and filling the contact hole. The plug within the contact hole includes a plug barrier metal formed in the contact hole, and a plug metal film formed on the plug barrier metal and filling the contact hole. The bit line barrier metal is formed completely on the plug defined within the contact hole.

Another feature of an embodiment of the present invention referring to a metal interconnection structure of a semiconductor device includes an inter-layer insulation film formed on a semiconductor substrate containing a bit line contact hole; a plug partially filling the contact hole, a bit line barrier metal defined on the plug and filling the rest of the contact hole; and a bit line formed on the bit line barrier metal and the inter-layer insulation film.

Still another feature of an embodiment of the present invention referring to a metal interconnection structure of a semiconductor device includes an inter-layer insulation film formed on a semiconductor substrate containing a bit line contact hole; a plug completely filling the contact hole; a bit line barrier metal defined on the plug in the contact hole; and a bit line formed on the bit line barrier metal and the inter-layer insulation film.

These and other features and aspects of the present invention will be readily apparent to those of ordinary skill in the art upon review of the detailed description that follows.

BRIEF DESCRIPTION OF THE DRAWINGS

A more complete appreciation of the present invention and the advantages thereof will become readily apparent by the following detailed description when considered in conjunction with the accompanying drawings in which like reference symbols indicate the same or similar components, wherein.

DETAILED DESCRIPTION OF THE INVENTION

Korean Patent Application No. 2001-27318, filed on May 18, 2001, and entitled: "Metal Interconnection With Low Resistance in a Semiconductor Device and the Method Thereof," is incorporated by reference herein in its entirety.

It should be understood that the following description of preferred embodiments is merely illustrative and that it should not be taken in a limiting sense. In the following detailed description, several specific details are set forth in order to provide a thorough understanding of the present invention. It should be obvious, however, to one skilled in the art that the present invention may be practiced with various modifications in form and details without departing from the spirit and scope of the present invention.

Figure 6:
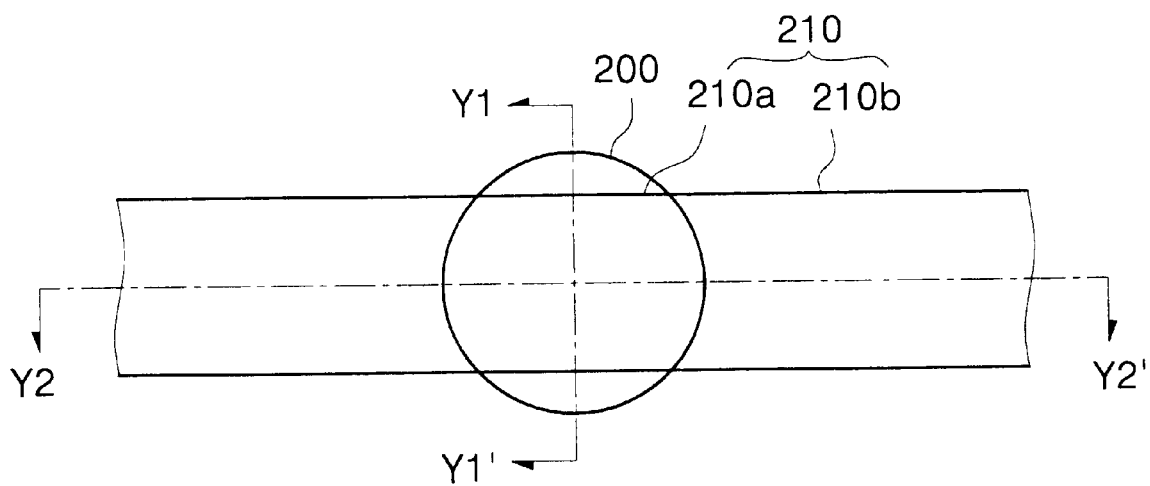
FIG. 6 illustrates a top elevation view showing a pattern of a bit line arranged in a semiconductor device according to an embodiment of the present invention.

FIG. 6 illustrates a plan pattern of a contact hole 200 and a bit line 210. FIGS. 7A through 7H illustrate sequential processing steps according to a preferred first embodiment of the present invention in a view taken along sectional line Y1–Y1' of FIG. 6. While FIGS. 8A through 8H illustrate the same in a view taken along sectional line Y2–Y2' of FIG. 6, which is orthogonal to Y1–Y1' of FIG. 6. The procedure of forming bit lines will be explained in conjunction with FIGS. 7A–7H and 8A–8H in parallel.

Figure 7A:
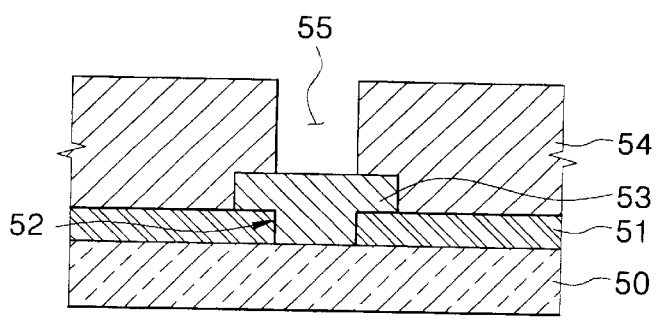
FIGS. 7A through 7H illustrate sectional views taken along a sectional line Y1–Y1' of FIG. 6 showing manufacturing steps of forming the bit line shown in FIG. 6 according to a first embodiment of the present invention.
Figure 8A:
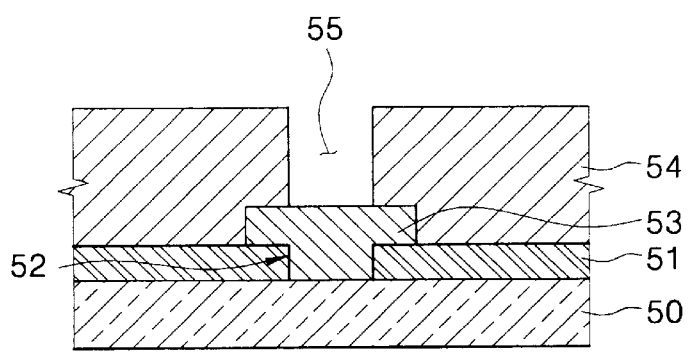
FIGS. 8A through 8H illustrate sectional views taken along a sectional line Y2–Y2' of FIG. 6, which is orthogonal to Y1–Y1' of FIG. 6, showing manufacturing steps of forming the bit line shown in FIG. 6 according to the first embodiment of the present invention.

Referring to FIGS. 7A and 8A, a contact hole 52 for a polysilicon plug is formed by a photolithography process after evaporating a first inter-layer insulation film 51 on a substrate 50. After depositing a polysilicon film on the first inter-layer insulation film 51 and the contact hole 52, a polysilicon plug 53 is patterned by a photolithography process. Next, a second interlayer insulation film 54 is deposited on the first inter-layer insulation film 51 and the polysilicon plug 53. A photolithography process is performed to expose the polysilicon plug 53 by removing a portion of the second interlayer insulation film 54 on the polysilicon plug 53, so that a bit line contact hole (DC: direct contact) 55 is formed. The bit line contact hole 55 may also be seen in the plan view of FIG. 6 as reference numeral 200.

The first and second inter-layer insulation films, 51 and 54, are preferably made of a TEOS (tetra-ethyl-orthosilicate) oxide film, a BPSG (boro-phosphosilicate glass), or a high-density plasma (HDP) oxide film.

Figure 7B:
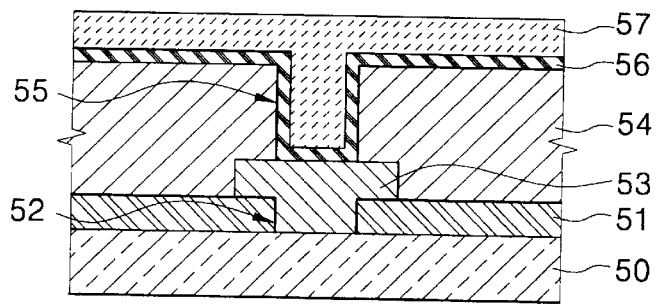
Figure 8B:
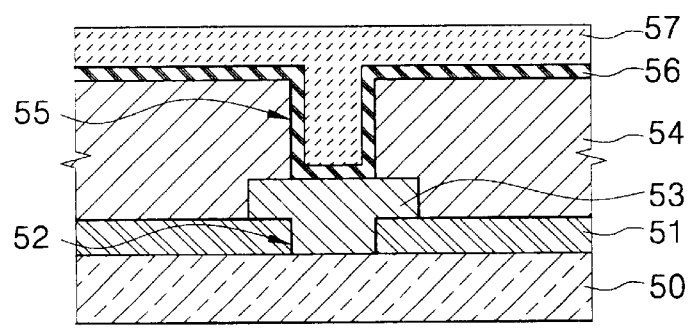

Referring to FIGS. 7B and 8B, a plug barrier metal 56 and a plug metal film 57 are sequentially deposited on the second inter-layer insulation film 54 and the bit line contact hole 55. The plug barrier metal 56 is preferably made of Ti/TiN film evaporated by CVD (chemical vapor deposition). The plug metal film 57 is preferably made of tungsten (W) evaporated by CVD.

Figure 7C:
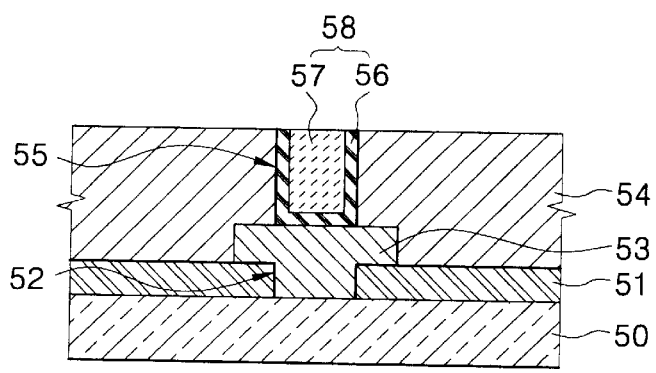
Figure 8C:
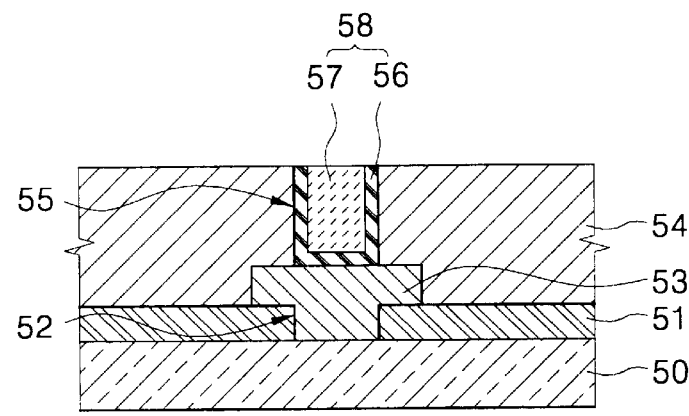

Referring to FIGS. 7C and 8C, a CMP (chemical-mechanical polishing) is performed to flatten the plug barrier metal 56 and the plug metal film 57. After the CMP process, the plug barrier metal 56 and the plug metal film 57 remain only in the bit line contact hole 55, forming a bit line plug 58. The CMP process removes other parts of the plug barrier metal 56 and the plug metal film 57, which are on the second inter-layer insulation film 54. The bit line plug 58 (including plug barrier metal 56 and plug metal film 57) formed in the bit line contact hole 55 electrically contacts the polysilicon plug 53 at the bottom of the contact hole 55.

In forming the bit line plug 58, an etch-back process, instead of the CMP process, may be employed to partially remove the plug barrier metal 56 and the plug metal film 57 until they are etched to an extent that the bit line contact hole 55 is filled.

Figure 7D:
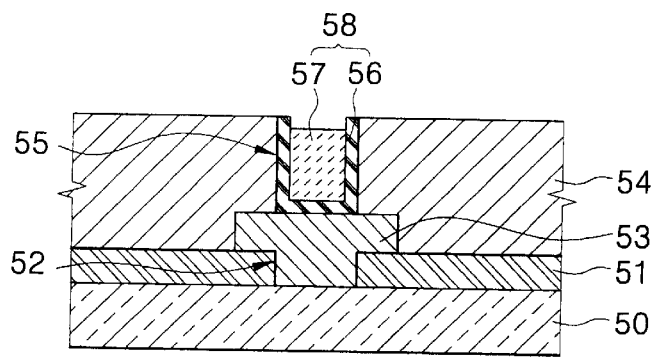
Figure 8D:
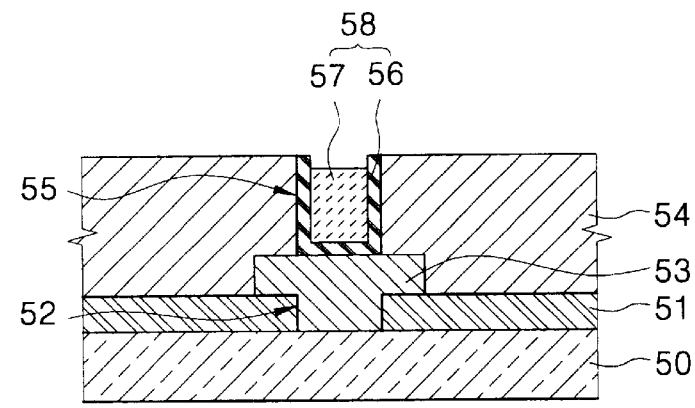

Then, referring to FIGS. 7D and 8D, the plug metal film 57, preferably made of tungsten, is partially etched away. At this stage, the partial etching is carried out with high etching selectivity between the plug barrier metal 56 and the plug metal film 57 in order to remove only the plug metal film 57 by several hundreds of angstroms. Thus, the plug 58, including the plug barrier metal 56 and the etched plug metal film 57, does not entirely fill the bit line contact hole 55.

Figure 7E:
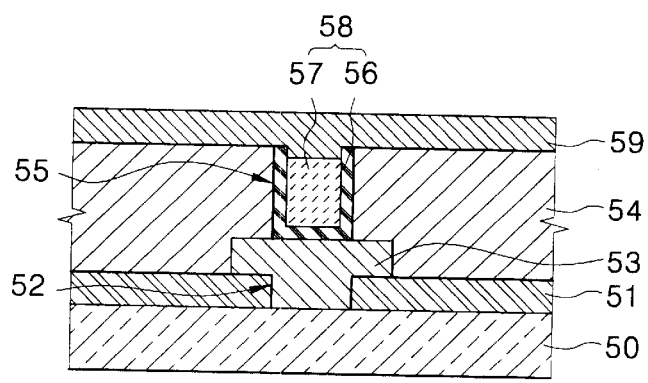
Figure 8E:
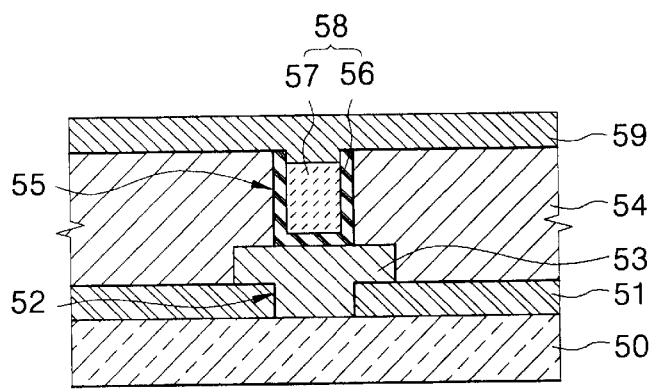

Next, referring to FIGS. 7E and 8E, a bit line barrier metal 59 is deposited on the second inter-layer insulation film 54 and the bit line plug 58, filling the contact hole 55. The bit line barrier metal 59 is preferably made of a titanium nitride film evaporated by a CVD or sputtering process.

Figure 7F:
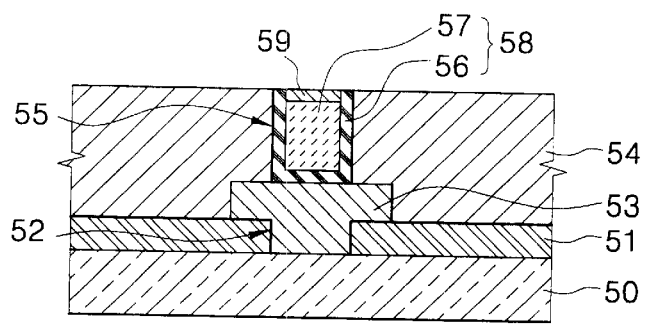
Figure 8F:
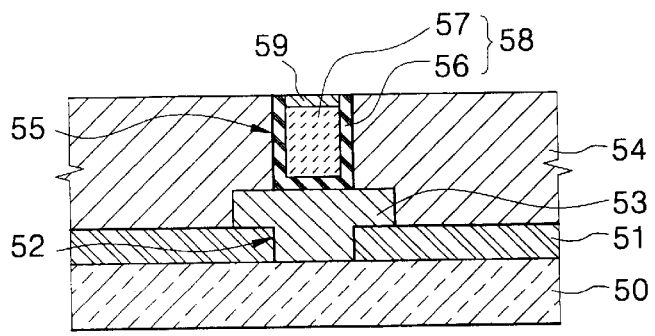

Referring to FIGS. 7F and 8F, a CMP process is preferably used to etch the bit line barrier metal 59 until the bit line barrier metal 59 remains only on the plug metal film 57. No portion of the bit line barrier metal 59 remains on the plug barrier metal 56 or the second inter-layer insulation film 54. As a result, the bit line barrier metal 59, together with the plug barrier metal 56 and the plug metal film 57, fills the bit line contact hole 55, and then acts as an etch stopper at a subsequent processing step for patterning bit lines.

It is also practicable to use an etch-back process rather than a CMP process to etch the bit line barrier metal 59 until the bit line barrier metal 59 remains only on the plug metal film 57.

Figure 7G:
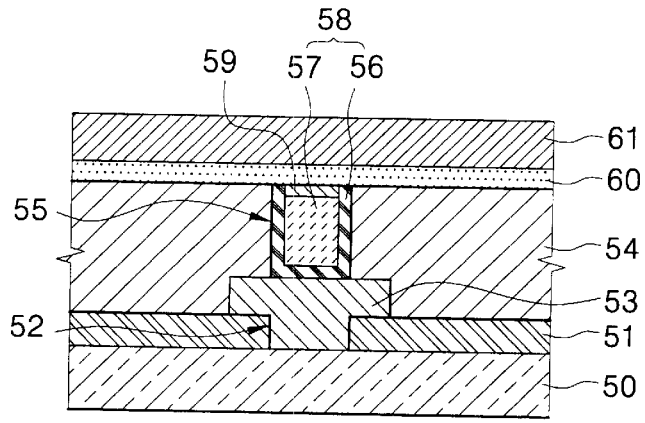
Figure 8G:
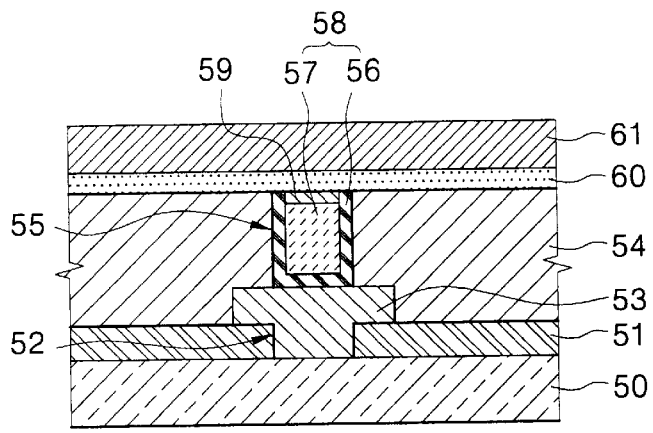

Next, referring to FIGS. 7G and 8G, a bit line metal film 60 and a bit line-capping layer 61 are sequentially deposited on the barrier metals 56 and 59, and the second inter-layer insulation film 54. The bit line-capping layer 61, preferably a nitride, is applied to a hard mask for a bit line patterning process subsequently performed. The bit line metal film 60 is preferably made of a tungsten film evaporated by a sputtering process.

Figure 7H:
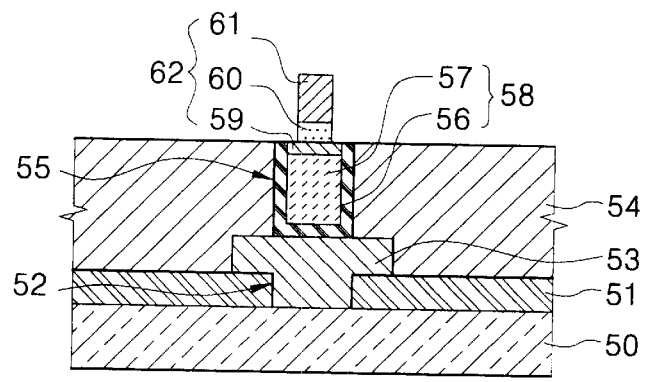
Figure 8H:
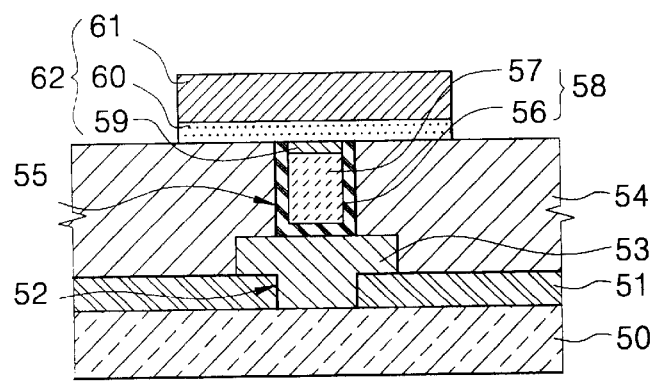

Finally, referring to FIGS. 7H and 8H, a photolithography process patterns a bit line 62 (corresponding to reference numeral 210 shown in FIG. 6) on the plug 58 and in the contact hole 55 by selectively etching the bit line-capping layer 61 and the bit line metal film 60 using the bit line barrier metal 59 as an etch stopper. The bit line 62 is formed of the bit line barrier metal 59 on the bit line plug 58, the bit line metal film 60, and the bit line-capping layer 61 on the bit line barrier metal 59.

Figure 1:
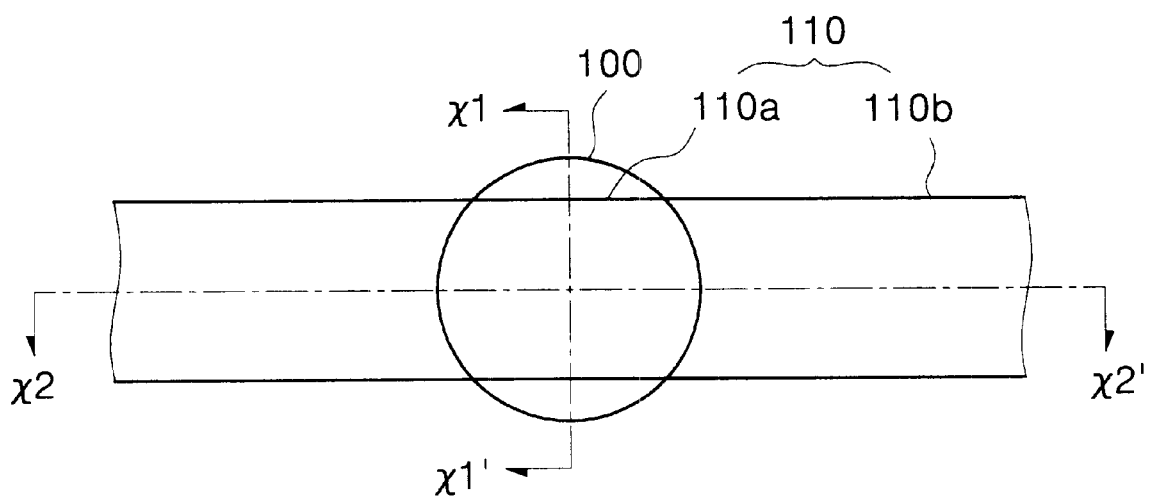
FIG. 1 illustrates a top elevation view showing a pattern of a bit line arranged in a conventional semiconductor device.
Figure 2A:
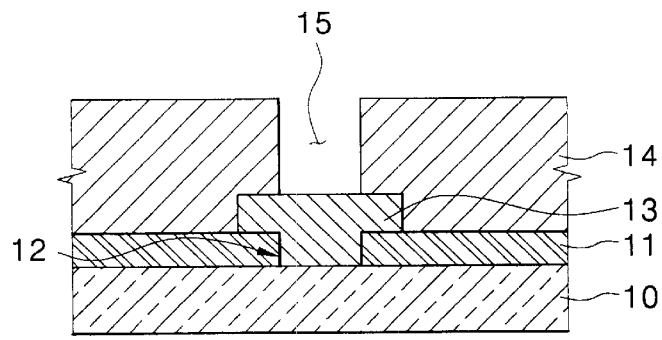
FIGS. 2A through 2F illustrate sectional views showing manufacturing steps of forming the conventional bit line shown in FIG. 1, taken along sectional line X1–X1' of FIG. 1.
Figure 2B:
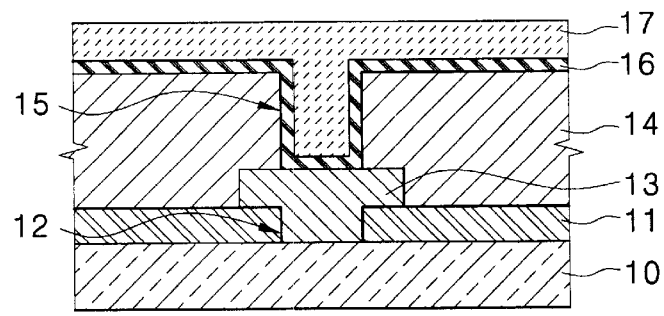
Figure 2C:
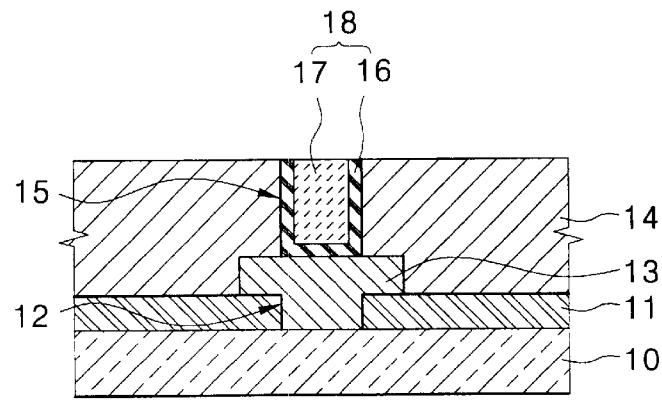
Figure 2D:
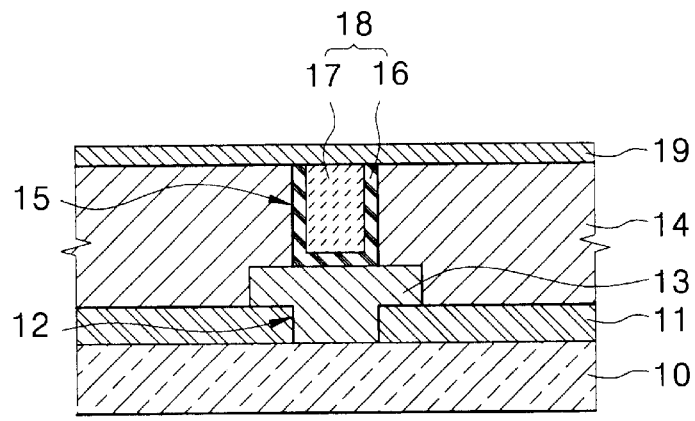
Figure 2E:
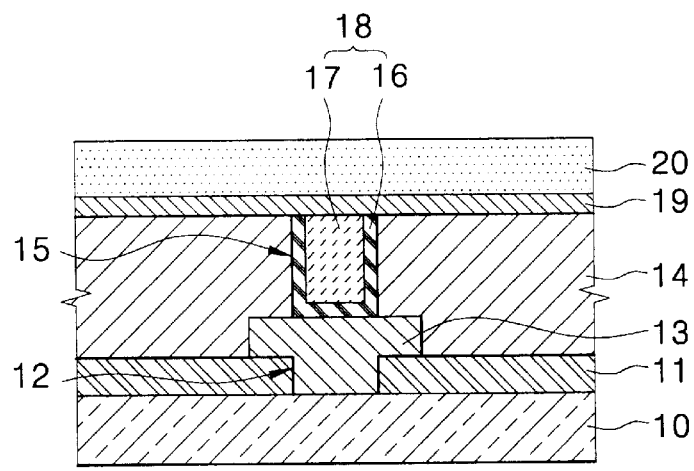
Figure 2F:
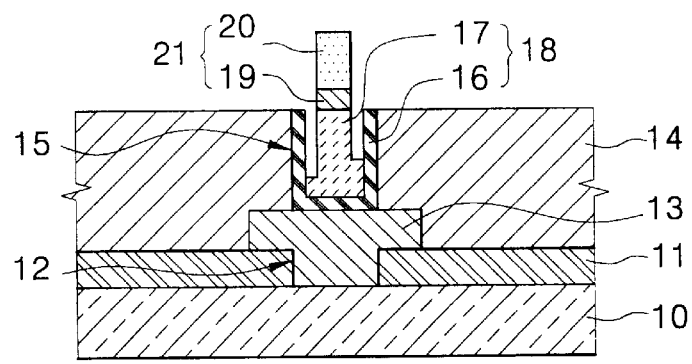
Figure 3A:
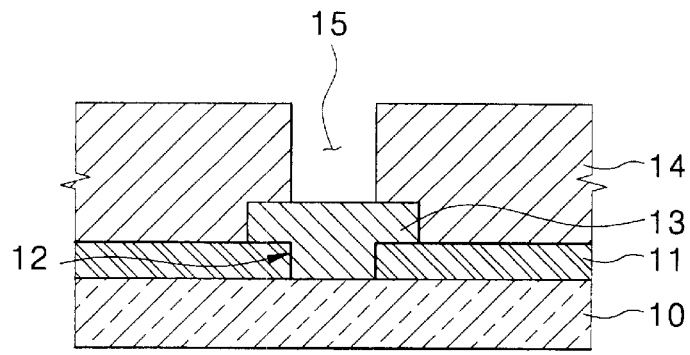
FIGS. 3A through 3F illustrate sectional views showing manufacturing steps of forming the conventional bit line shown in FIG. 1, taken along sectional line X2–X2' of FIG. 1, which is orthogonal to X1–X1' of FIG. 1.
Figure 3B:
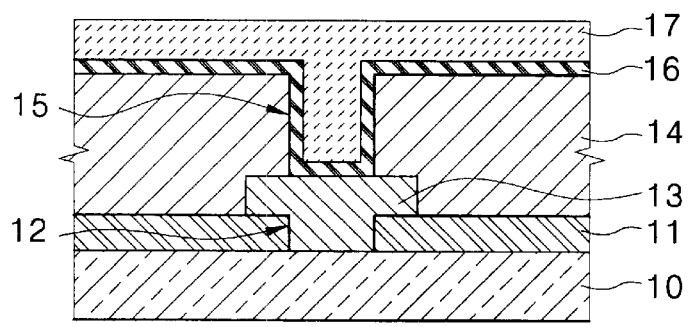
Figure 3C:
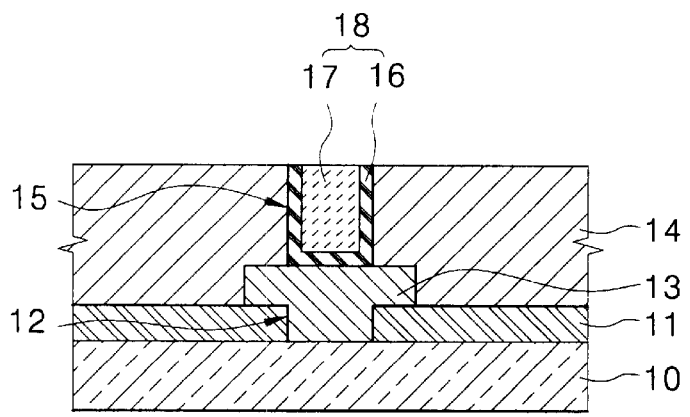
Figure 3D:
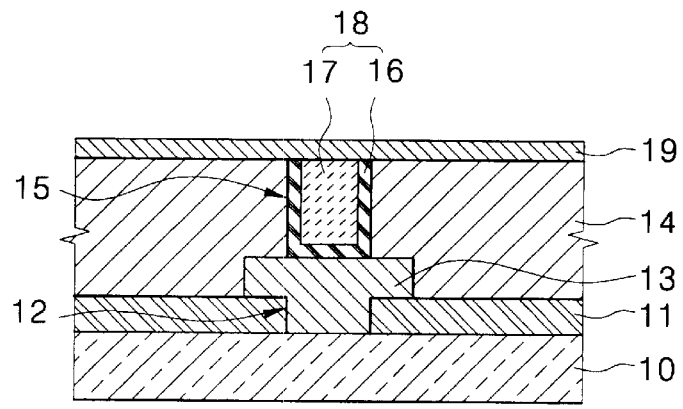
Figure 3E:
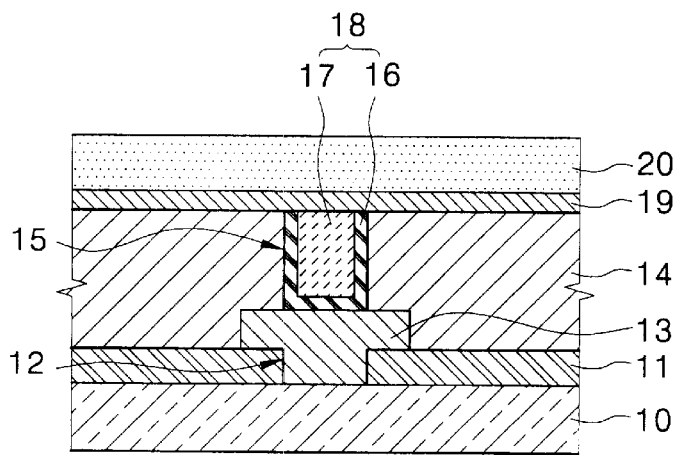
Figure 3F:
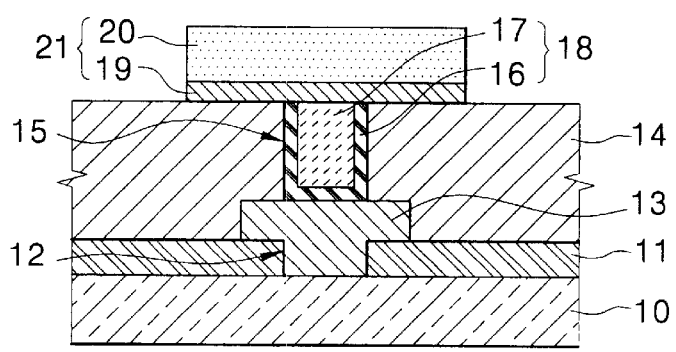
Figure 4A:
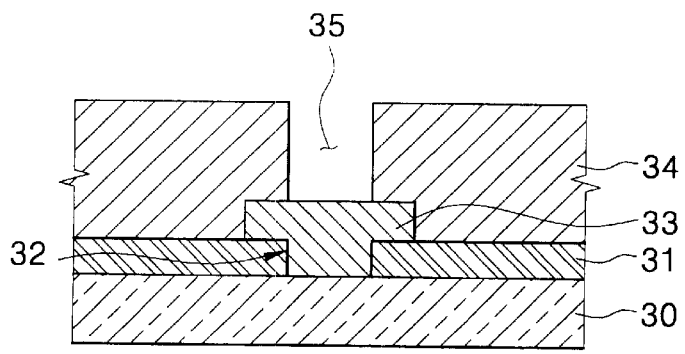
FIGS. 4A through 4F illustrate sectional views showing alternate manufacturing steps of forming the conventional bit line shown in FIG. 1, taken along sectional line X1–X1' of FIG. 1.
Figure 4B:
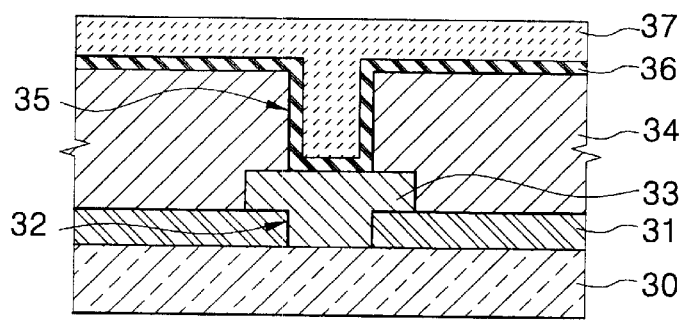
Figure 4C:
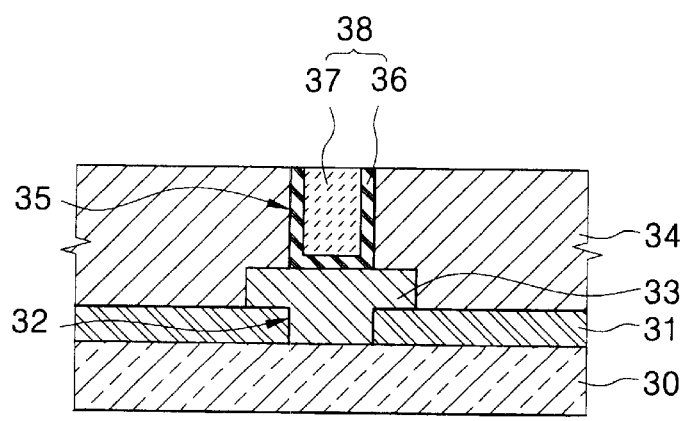
Figure 4D:
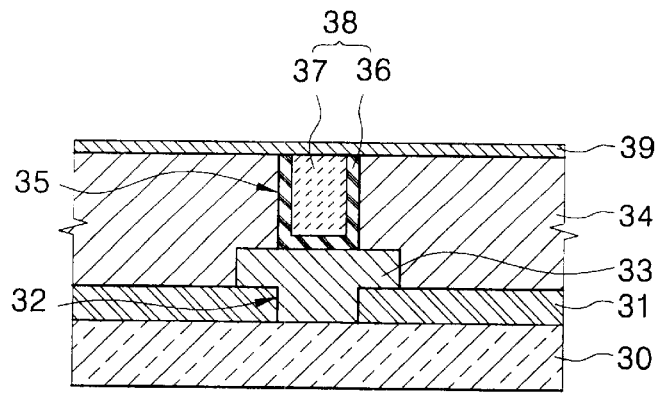
Figure 4E:
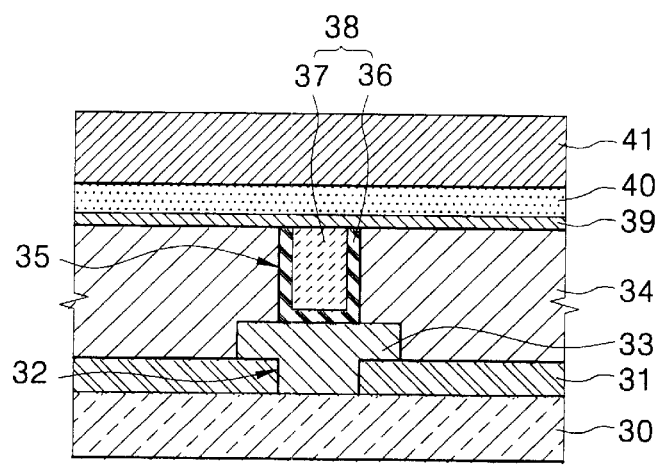
Figure 4F:
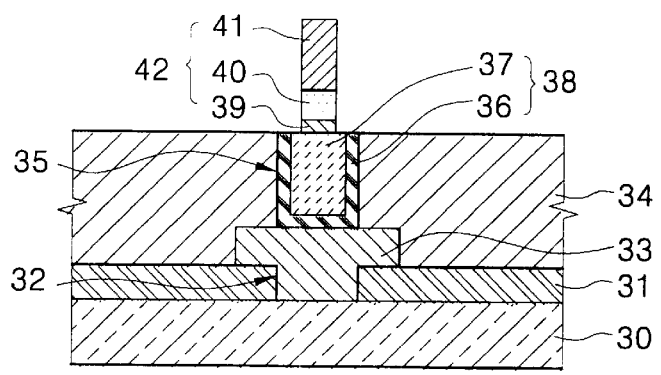
Figure 5A:
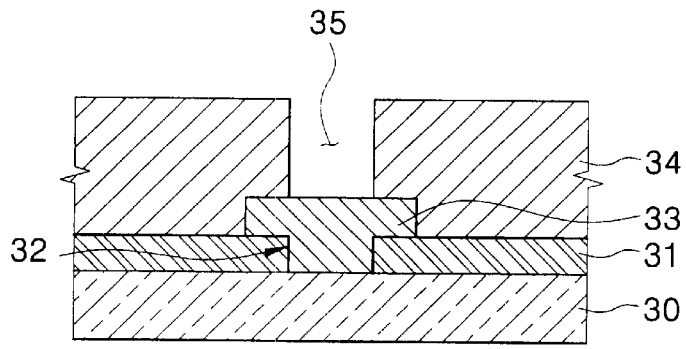
FIGS. 5A through 5F illustrate sectional views showing alternate manufacturing steps of forming the conventional bit line shown in FIG. 1, taken along sectional line X2–X2' FIG. 1, which is orthogonal to X1–X1' of FIG. 1.
Figure 5B:
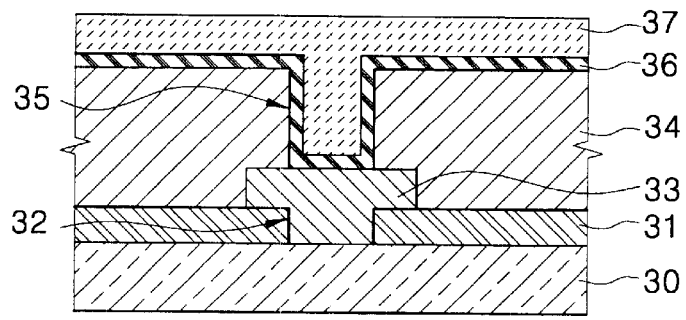
Figure 5C:
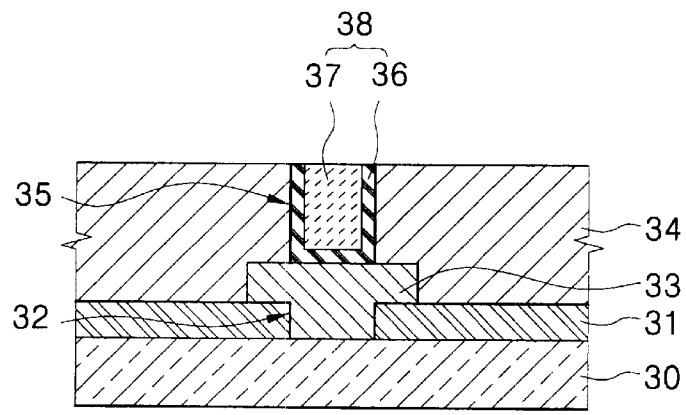
Figure 5D:
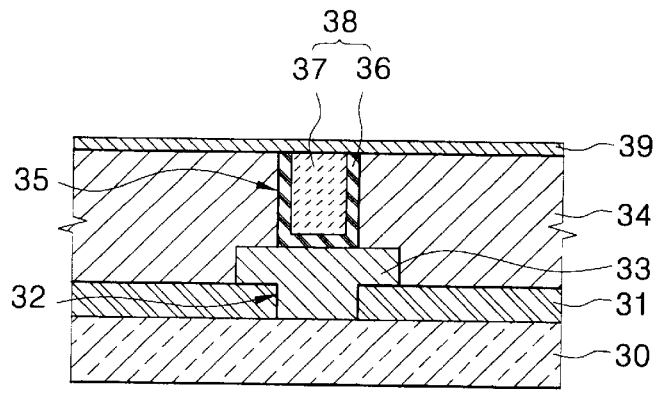
Figure 5E:
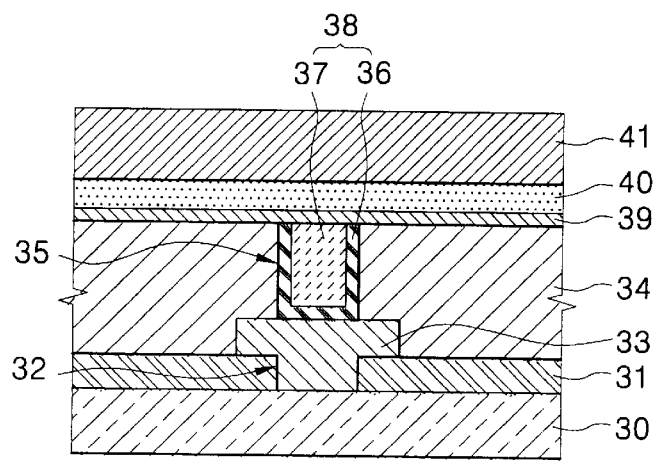
Figure 5F:
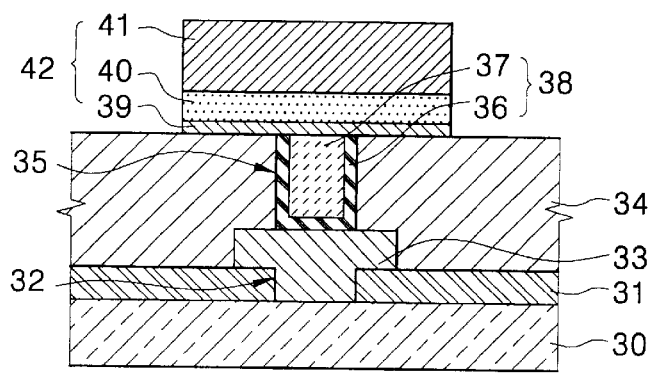

The bit line structure of FIG. 6 or 8H is distinct from the conventional bit line structure of FIG. 1 or 5F. As shown in FIG. 5F, the bit line barrier metal 39 is formed on the second inter-layer insulation film 34 as well as on the contact hole 35, and then the bit line 42 is formed on the bit line barrier metal 39. That is, referring to FIGS. 1 and 5F, the bit line barrier metal 39 is formed at all regions of a contact part 110a and an interconnection part 110b where the bit line 110 faces the plug 38 in the contact hole 35. On the other hand, as shown in FIGS. 6 and 8H, the bit line barrier metal 59, being positioned in the contact hole 55, is formed only on the plug metal film 57, preferably of tungsten, and not on the second inter-layer insulation film 54. Therefore, referring to FIGS. 6 and 8H, a contact part where the bit line 210 faces the plug 58 is only assigned to the bit line barrier metal 59, and an interconnection part 210B lies directly on the second inter-layer insulation film 54.

As a result, in this embodiment of the present invention, the bit line barrier metal 59 is formed only on the plug metal film 57 within the contact hole 55, and the bit line metal film 60, formed preferably of tungsten, is formed directly on the second inter-layer insulation film 54, with the exception of a part of the bit line metal film 60 formed on the plug 58. Thus, in the present invention, interconnection resistance is reduced and morphology of the bit line metal film 60 is enhanced.

Figure 11A:
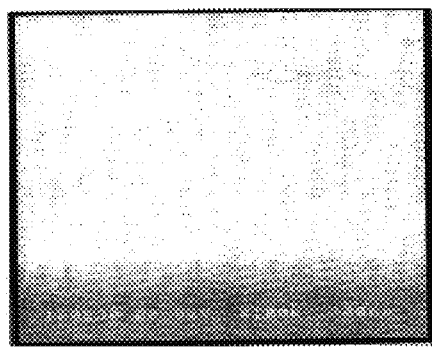
FIG. 11A illustrates a microscopic view showing morphology of a CVD tungsten film for a bit line formed on a CVD titanium film according to a conventional method.
Figure 11B:
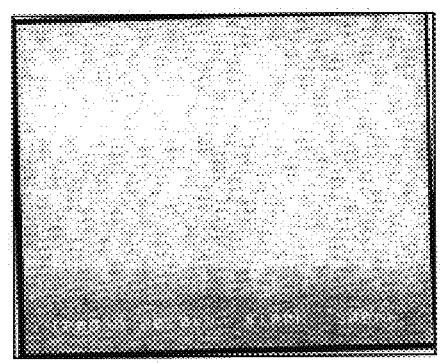
FIG. 11B illustrates a microscopic view showing morphology of a sputtered tungsten film for a bit line formed on a sputtered titanium film according to an embodied method of the present invention.
Figure 11C:
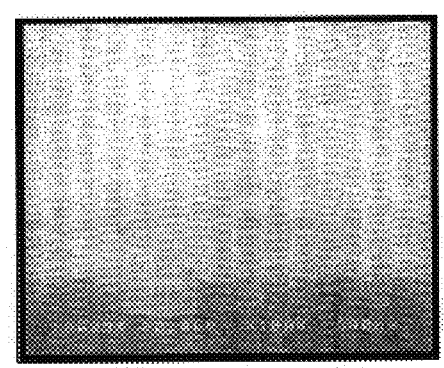
FIG. 11C illustrates a microscopic view showing morphology of a sputtered tungsten film for a bit line formed on a CVD titanium film according to an embodied method of the present invention.

FIG. 11B shows a microscopic view regarding morphology of the bit line metal film 60 that is made of tungsten and formed by a sputtering process on the barrier metal 59 that is made of a sputtered TiN film. FIG. 11C shows a microscopic view regarding morphology of the bit line metal film 60 that is made of tungsten and formed by a sputtering process on the second inter-layer insulation film 54.

As shown in FIG. 11C, when the sputtered tungsten film is formed on the second inter-layer insulation film 54 with thickness of 800 Å, resistance of the bit line, Rs, is 1.7 Ω, a value that is relatively low, and an AFM RMS value for surface harshness is lower than 1.5 nm, a value that is regarded to be indicative of better morphology.

Meanwhile, as shown in FIG. 11C, the sputtered tungsten film formed on the barrier metal 59 with a thickness of 800 Å has more grain boundaries than the tungsten film shown in FIG. 11C, because the structure of the tungsten film has grown into columnar crystal grains in conjunction with a columnar structure of the TiN film of the bit line barrier metal 59. Thus, although resistance of the bit line is 3.0 Ω, a resistance value larger than that of FIG. 11B, an AFM RMS value for surface harshness is lower than 1.5 nm, which indicates better morphology.

As previously described, there is a difference in the resistance of the bit line metal film 60 made of sputtered tungsten when it is formed on the barrier metal 59 made of a TiN film than when it is formed on the second inter-layer insulation film 54 made of an oxide. That is, resistance on the second inter-layer insulation film 54 of oxide is smaller than that on the bit line barrier metal 59 of TiN. Also, the morphology of the bit line metal film 60, when it is made of a tungsten film, is better when it is evaporated on an oxide film by a sputtering process than by a CVD process.

In order to reduce the resistance of the bit line 62 as well as to prevent the plug metal film 57 made of tungsten from being etched during the etching process, the bit line barrier metal 59 is formed only at the contact part 210A where the contact hole 55 is positioned and does not exist at the interconnection part 210B. Also, the bit line metal film 60 of tungsten is evaporated on the bit line barrier metal 59 and the second inter-layer insulation film 54 by means of a sputtering process.

As a result, since resistance values of the bit line 62 on the contact hole 55 and on the second inter-layer insulation film 54 of oxide are 3.0 Ω and 1.0 Ω, respectively, overall resistance may be decreased from that of the conventional art by about 23%.

Moreover, as the bit line metal film 60, made of sputtered tungsten, is formed directly on the second inter-layer insulation film 54, made of an oxide, at regions except for on the contact hole 55, the harshness is decreased to less than 1.5 nm, indicating a better morphology than in the conventional art.

Accordingly, a width and resistance of the bit line may be reduced. In addition, it is more advantageous in improving a void margin when an inter-layer insulation film of high-density plasma oxide is deposited after forming a spacer at a sidewall of the bit line.

FIGS. 9A through 9G illustrate sequential processing steps according to another embodiment of the present invention in a view taken along sectional line Y1–Y1' of FIG. 6, while FIGS. 10A through 10G illustrate sequential processing steps in a view taken along sectional line Y2–Y2' of FIG. 6, which is orthogonal to Y1–Y1' of FIG. 6. This procedure of forming bit lines will be explained in conjunction with FIGS. 9A–9G and 10A–10G in parallel.

This embodiment differs from the former embodiment in forming a bit line barrier metal by means of a photolithography process instead of a CMP process.

Figure 9A:
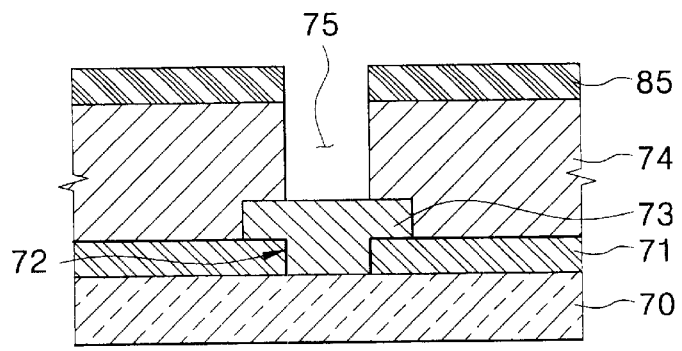
FIGS. 9A through 9G illustrate sectional views taken along sectional line Y1–Y1' of FIG. 6 showing manufacturing steps of forming the bit line shown in FIG. 6 according to a second embodiment of the present invention.
Figure 10A:
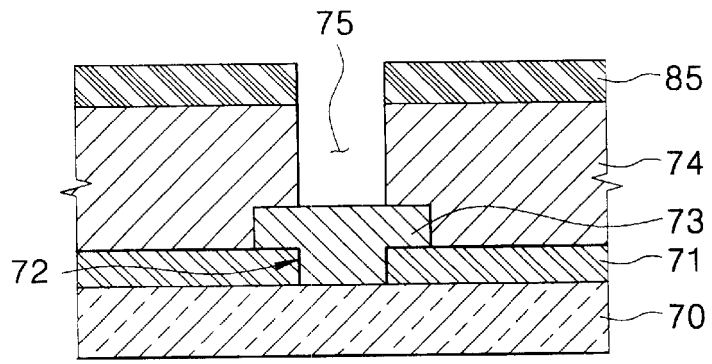
FIGS. 10A through 10G illustrate sectional views taken along sectional line Y2–Y2' of FIG. 6, which is orthogonal to Y1–Y1' of FIG. 6, showing manufacturing steps of forming the bit line shown in FIG. 1 according to the second embodiment of the present invention.

Referring to FIGS. 9A and 10A, a contact hole 72 for a polysilicon plug is formed by a photolithography process after evaporating a first interlayer insulation film 71 on a substrate 70. After depositing a polysilicon film on the first inter-layer insulation film 71 and the contact hole 72, a polysilicon plug 73 is patterned by a photolithography process. Next, a second interlayer insulation film 74 is deposited on the first inter-layer insulation film 71 and the polysilicon plug 73. A photolithography process is performed to expose the polysilicon plug 73 by removing a part of the second inter-layer insulation film 74 on the polysilicon plug 73, so that a bit line contact hole (DC: direct contact) 75 is formed. A mask 85 is utilized in the photolithography process for forming the bit line contact hole 75. The bit line contact hole 75 may also be seen in FIG. 6 as reference numeral 200.

The first and second inter-layer insulation films, 71 and 74, are preferably made of a TEOS (tetra-ethyl-ortho-silicate) oxide film, a BPSG (boro-phosphosilicate glass), or a high-density plasma (HDP) oxide film.

Figure 9B:
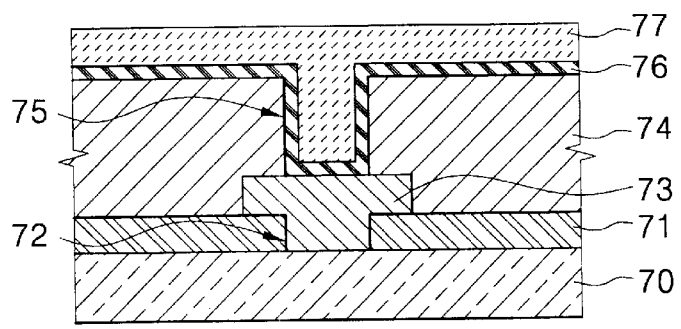
Figure 10B:
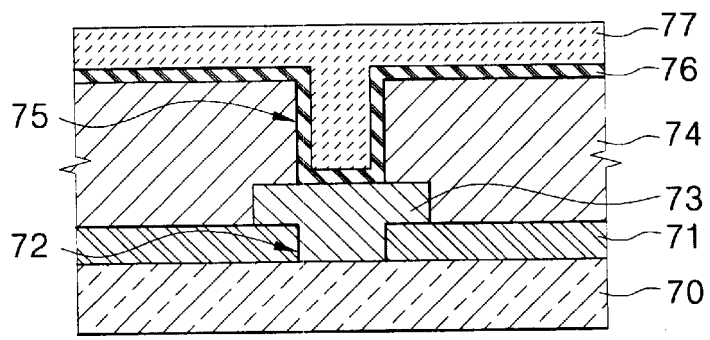

Referring to FIGS. 9B and 10B, a plug barrier metal 76 and a plug metal film 77 are sequentially deposited on the second inter-layer insulation film 74 and the bit line contact hole 75. The plug barrier metal 76 is preferably made of a Ti/TiN film evaporated by a CVD (chemical vapor deposition) process, while the plug metal film 77 is preferably made of a tungsten (W) film evaporated by CVD.

Figure 9C:
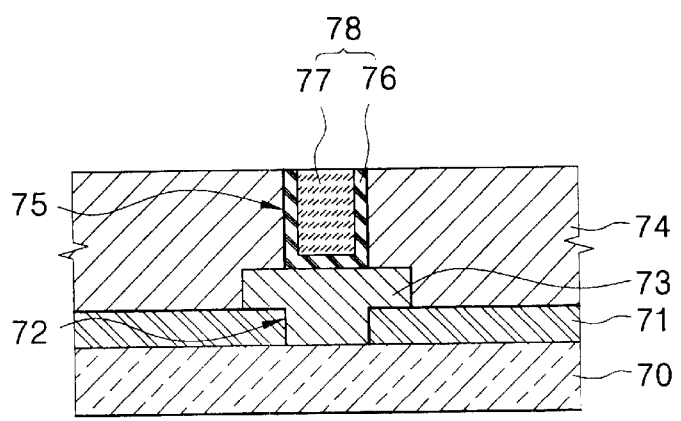
Figure 10C:
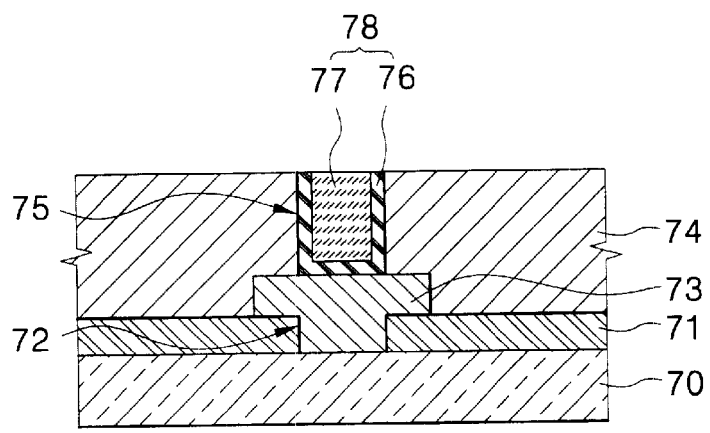

Referring to FIGS. 9C and 10C, a CMP (chemical-mechanical polishing) or an etch-back process is carried out to flatten the plug barrier metal 76 and the plug metal film 77. After the CMP or the etch-back process, the plug barrier metal 76 and the plug metal film 77 remain only in the bit line contact hole 75, forming a bit line plug 78 that completely fills the bit line contact hole 75. The CMP process removes other portions of the plug barrier metal 76 and the plug metal film 77, which are formed on the second inter-layer insulation film 74. The bit line plug 78 (including both the plug barrier metal 76 and the plug metal film 77) formed in the bit line contact hole 75 electrically contacts the polysilicon plug 73 at the bottom of the contact hole 75.

Figure 9D:
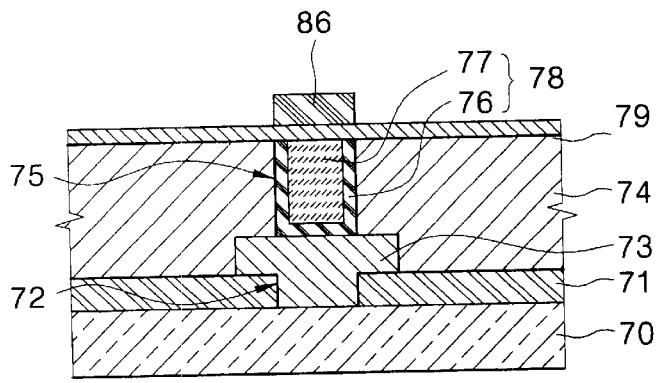
Figure 10D:
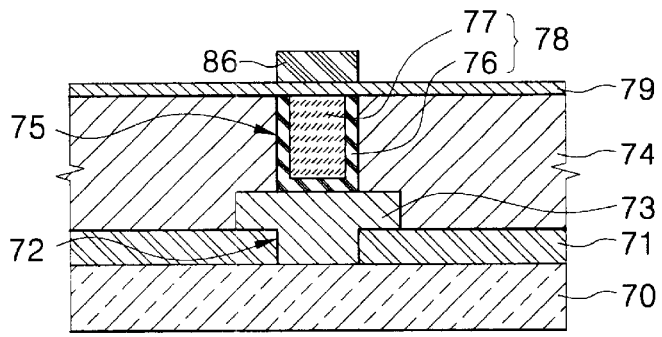

Then, referring to FIGS. 9D and 10D, a bit line barrier metal 79 is deposited on the second inter-layer insulation film 74 and the bit line plug 78 filling the bit line contact hole 75. The bit line barrier metal 79 is preferably made of a titanium nitride film evaporated by a CVD or sputtering process. Thereafter, a photoresist film 86 is overspread on the bit line barrier metal 79 and patterned by a mask that is the same as that used in forming the bit line contact hole 75. After patterning the photoresist film 86, photoresist film 86 remains only on the bit line barrier metal 79 over the bit line contact hole 75.

In this embodiment, the photoresist films for the bit line barrier metal 79 and the bit line contact hole 75 are characterized to be opposite to each other so that preparing an additional mask for patterning the barrier metal is not necessary. For instance, if the photoresist film 85 for trenching the bit line contact hole 75 is a positive type, the photoresist film 86 for patterning the bit line barrier metal 79 is a negative type. On the contrary, if the photoresist film 85 is set to a negative type, then the photoresist film 86 is a positive type.

Figure 9E:
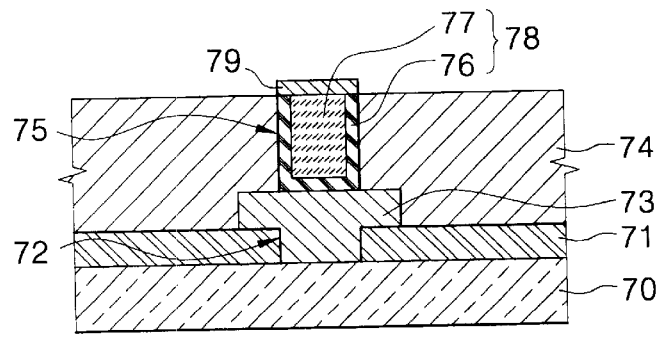
Figure 10E:
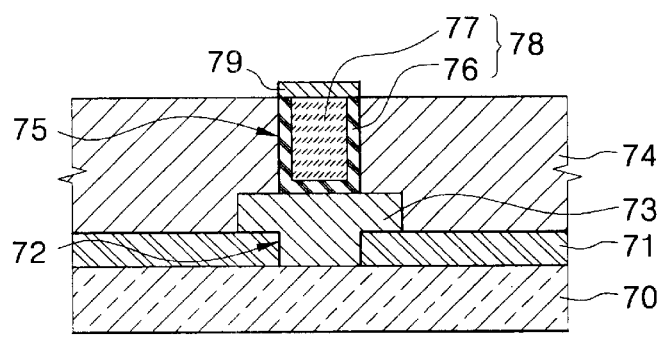

Referring to FIGS. 9E and 10E, after patterning the bit line barrier metal 79 with the photoresist film 86 to define the bit line barrier metal 79 only on the plug 78, the photoresist film 86 is removed. The bit line barrier metal 79, formed on the plug 78 that completely fills the bit line contact hole 75, acts as an etch stopper in a subsequent processing step for patterning bit lines.

Figure 9F:
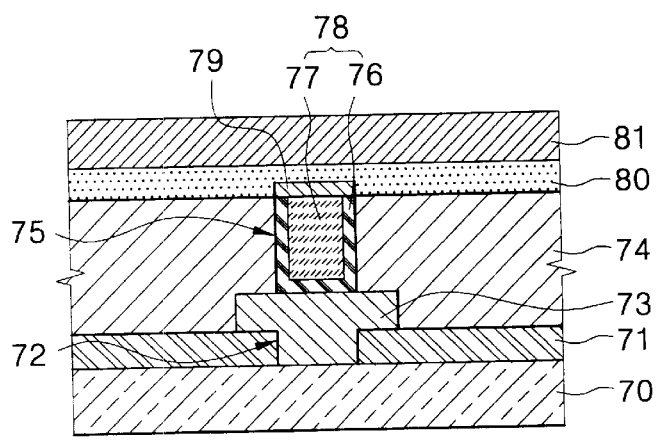
Figure 9G:
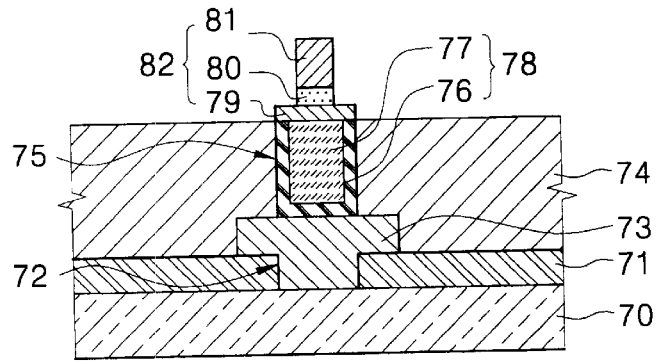
Figure 10F:
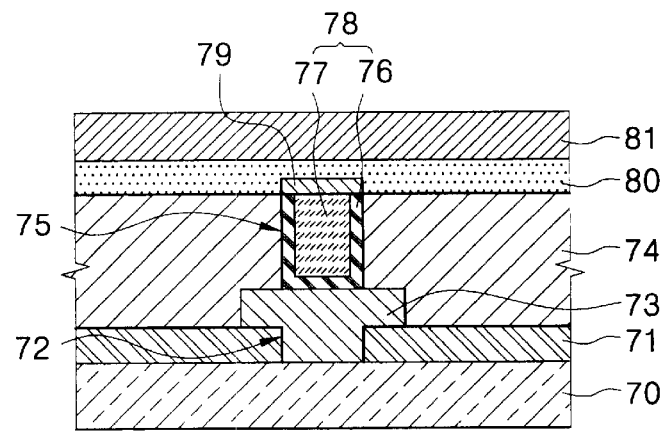
Figure 10G:
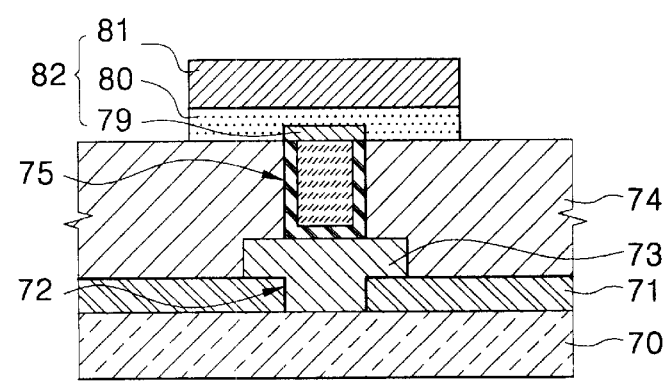

Next, referring to FIGS. 9F and 10F, a bit line metal film 80 and a bit line-capping layer 81 are sequentially deposited on the bit line barrier metal 79 and the second inter-layer insulation film 74. The bit line metal film 80 is preferably made of sputtered tungsten, and the bit line-capping layer 81 is preferably made of a nitride. Finally, as shown in FIGS. 9G and 10G, a photolithography process is used to pattern a bit line 82 (corresponding to the reference numeral 210 shown in FIG. 6) on the plug 78 in the bit line contact hole 75 by selectively etching the bit line-capping layer 81 and the bit line metal film 80 and using the bit line barrier metal 79 as an etch stopper. The bit line 82 is formed of the bit line barrier metal 79 on the bit line plug 78, the bit line metal film 80 of sputtered tungsten on the barrier metal 79, and the bit line-capping layer 81 of nitride.

The microscopic views shown in FIGS. 11B and 11C are also relevant to a result of this embodiment. The bit line resistance on the bit line barrier metal 79 (or on the plug 78) of sputtered tungsten is 3.0 Ω, while the bit line resistance on the second inter-layer insulation film of oxide is 1.0 Ω. Thus, as in the former embodiment, this embodiment of the present invention may allow a reduction in overall bit line resistance of about 23% over that of the conventional art.

Moreover, as the bit line metal film 80 of sputtered tungsten is formed directly on regions of the second inter-layer insulation film 74, and not on the barrier metal 79 that is on the plug 78, the harshness may be reduced to less than 1.5 nm, improving morphology over that of the conventional art. In addition, it is more advantageous in improving a void margin when an inter-layer insulation film of high-density plasma oxide is deposited after forming a spacer at a sidewall of the bit line.

As stated above, the latter embodiment of the present invention is advantageous in reducing bit line resistance and obtaining better morphology since the barrier metal is formed only on the plug filling the contact hole, as in the former embodiment. Thus, it is possible to form finer bit lines applicable to higher integration in semiconductor devices.

As previously noted, the conventional art suffers from high resistance and poor morphology in the bit line on the barrier metal that is employed to prevent over-etching the plug in the contact hole for patterning the bit line.

According to the embodiments of the present invention, the bit line metal film is formed on the inter-layer insulation film and not on the barrier metal, as it is in the conventional art, thereby allowing overall resistance of the bit line to be reduced and morphology to be improved in the present invention.

The present invention, in addition to preventing constructive defects, which cause single-bit errors, such as over-etching the plug in the contact hole during formation of a bit line structure, also secures reliable techniques of bit line interconnection architecture and a method of forming the same that are very efficient and adaptable to high-density semiconductor devices with narrow conductive interconnection lines.

Preferred embodiments of the present invention have been disclosed herein and, although specific terms are employed, they are used in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A method of forming a metal interconnection structure comprising:
   forming an inter-layer insulation film on a semiconductor substrate, the inter-layer insulation film containing a bit line contact hole;
   forming a plug in the bit line contact hole; and
   forming a bit line including a bit line barrier metal formed on the plug and a bit line metal film formed on the bit line barrier metal and the inter-layer insulation film.

2. The method as claimed in claim 1, wherein forming the plug comprises:
   depositing a plug barrier metal on the inter-layer insulation film and in the bit line contact hole;
   depositing a plug metal film on the plug barrier metal; and
   forming the plug constructed of the plug barrier metal and the plug metal film which fill the bit line contact hole by etching the plug barrier metal and the plug metal film.

3. The method as claimed in claim 2, wherein the plug barrier metal is a Ti/TiN film deposited by means of a CVD process.

4. The method as claimed in claim 2, wherein the plug metal film is a tungsten film deposited by means of a CVD process.

5. The method as claimed in claim 2, wherein the plug barrier metal and the plug metal film are etched flat by means of a CMP process to fill the bit line contact hole.

6. The method as claimed in claim 2, wherein the plug barrier metal and the plug metal film are etched flat by means of an etch-back process to fill the bit line contact hole.

7. The method as claimed in claim 1, wherein the step of forming the bit line barrier metal on the plug comprises:
   partially etching the plug within the bit line contact hole;
   depositing the bit line barrier metal on the inter-layer insulation film and on the plug that is partially etched away; and
   etching the bit line barrier metal to be defined on the plug that is partially etched away and within the bit line contact hole.

8. The method as claimed in claim 7, wherein the bit line barrier metal is a TiN film deposited by means of either a CVD process or a sputtering process.

9. The method as claimed in claim 7, wherein etching the bit line barrier metal is accomplished by means of either a CMP process or an etch-back process.

10. The method as claimed in claim 1, wherein the step of forming the bit line barrier metal comprises:
    depositing a bit line barrier metal on the inter-layer insulation film and on the plug; and
    patterning the bit line barrier metal to be defined on the plug.

11. The method as claimed in claim 10, wherein the bit line barrier metal is a TiN film deposited by means of either a CVD process or a sputtering process.

12. The method as claimed in claim 1, wherein the bit line metal film is made of a tungsten film.

13. The method as claimed in claim 12, wherein the tungsten film is deposited by means of a sputtering process.

14. The method as claimed in claim 1, wherein the bit line further includes a capping layer formed on the bit line metal film.

15. The method as claimed in claim 14, wherein the capping layer is made of a nitride film.

16. The method as claimed in claim 1, wherein a width of the bit line is smaller than a diameter of the bit line contact hole.

17. A method of forming a metal interconnection structure comprising:
    forming an inter-layer insulation film on a semiconductor substrate, the inter-layer insulation film containing a bit line contact hole;
    forming a plug in the bit line contact hole;
    partially etching the plug in the bit line contact hole;
    forming a bit line barrier metal to be defined on the plug that has been partially etched; and
    forming a bit line on the bit line barrier metal and the inter-layer insulation film.

18. The method as claimed in claim 17, wherein the plug is constructed of a plug barrier metal and a plug metal film that are formed in the bit line contact hole.

19. The method as claimed in claim 18, wherein the plug barrier metal is made of a Ti/TiN film and the plug metal film is made of one of a CVD tungsten film and a sputtered tungsten film.

20. The method as claimed in claim 17, wherein the bit line barrier metal is formed of a TiN film deposited by means of either a CVD process or a sputtering process.

21. The method as claimed in claim 20, wherein the bit line barrier metal is defined on the plug that has been partially etched by being etched through a CMP process to fill the bit line contact hole.

22. The method as claimed in claim 20, wherein the bit line barrier metal is defined on the plug that has been partially etched by being etched through an etch-back process to fill the bit line contact hole.

23. The method as claimed in claim 17, wherein the bit line is made of a sputtered tungsten film.

24. The method of claim 17, wherein a width of the bit line is smaller than a diameter of the bit line contact hole.

25. A method of forming a metal interconnection structure comprising:

forming an inter-layer insulation film on a semiconductor substrate;

forming a bit line contact hole by using a mask to selectively etch the inter-layer insulation film;

forming a plug in the bit line contact hole;

depositing a bit line barrier metal on the plug and the inter-layer insulation film;

etching the bit line barrier metal to be defined on the plug; and forming a bit line on the bit line barrier metal and the inter-layer insulation film.

26. The method as claimed in claim 25, wherein the plug is constructed of a plug barrier metal formed in the bit line contact hole, and a plug metal film formed on the bit line barrier metal and filling the bit line contact hole.

27. The method as claimed in claim 26, wherein the plug barrier metal is made of a Ti/TiN film and the plug metal film is made of one of a CVD tungsten film and a sputtered tungsten film.

28. The method as claimed in claim 25, wherein the bit line barrier metal is made of one of a sputtered TiN film and a CVD TiN film.

29. The method as claimed in claim 28, wherein the bit line barrier metal is patterned by employing a mask which is the same as that used in forming the bit line contact hole.

30. The method as claimed in claim 25, wherein the bit line is made of a sputtered tungsten film.

31. The method as claimed in claim 25, wherein a width of the bit line is smaller than a diameter of the bit line contact hole.

* * * * *